United States Patent [19]

Katsuoka et al.

[11] Patent Number: 4,916,955
[45] Date of Patent: Apr. 17, 1990

[54] CRYSTAL INGOT LIFTING LOAD MEASURING DEVICE

[75] Inventors: Nobuo Katsuoka, Takasaki; Kouji Mizuishi, Annaka; Yoshihiro Hirano, Annaka; Kenichi Sato, Annaka; Seiichiro Otsuka, Tomioka, all of Japan

[73] Assignee: Shin-Etsu Handotai Company, Limited, Tokyo, Japan

[21] Appl. No.: 230,777

[22] Filed: Aug. 10, 1988

[30] Foreign Application Priority Data

Aug. 18, 1987 [JP] Japan .............................. 62-204843

[51] Int. Cl.⁴ .............................................. G01L 5/04
[52] U.S. Cl. ............................. 73/862.44; 73/862.56; 422/249
[58] Field of Search ........... 73/862.54, 862.56, 862.44, 73/862.45, 862.47, 862.48, 862.42; 156/601, 617.1; 422/249; 254/272, 273

[56] References Cited

U.S. PATENT DOCUMENTS 2,656,719 10/1953 Webber ............................. 73/862.45
3,289,473 12/1966 Louda ............................... 73/862.44
4,663,128 5/1987 Helgeland .......................... 422/249

Primary Examiner—Charles A. Ruehl
Attorney, Agent, or Firm—Browdy and Neimark

[57] ABSTRACT

A load measuring device for measuring the pulling up load of a monocystalline rod (38) grown by the Czochralski method utilizes a strain gauge (20). The monocrystalline rod (38) is pulled up by wire rope (36) consisting of multiple strands. The pulley (34) guiding the wire rope between a drum (36) and a crystal holder (44) has a guide groove which has a cross-sectional shape which is substantially identical to a semicircle circumscribing the wire rope.

7 Claims, 3 Drawing Sheets

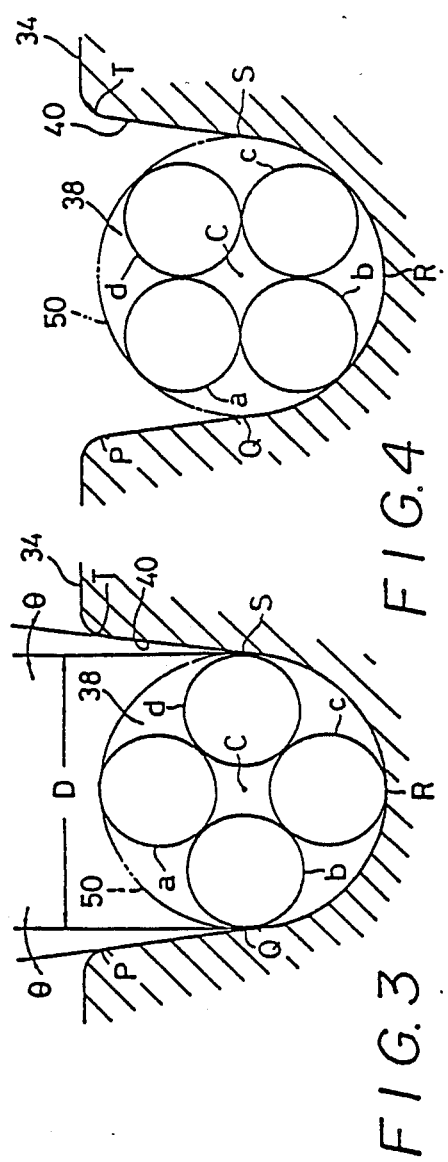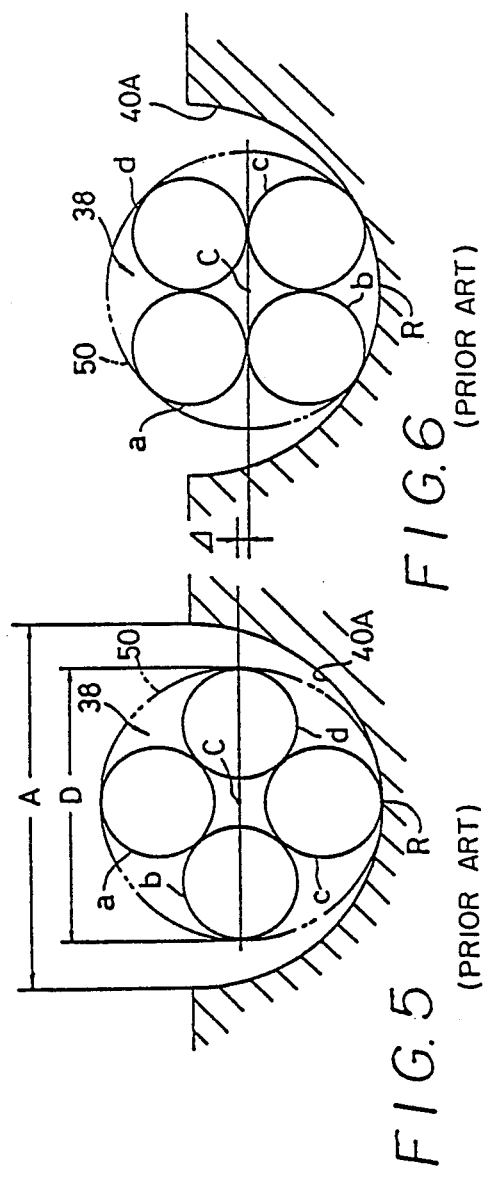
FIG.3  FIG.4
FIG.5 (PRIOR ART)  FIG.6 (PRIOR ART)

CRYSTAL INGOT LIFTING LOAD MEASURING DEVICE

BACKGROUND OF THE INVENTION

1. Field of the Invention

The present invention relates to a load measuring device for pulling up a monocrystalline rod that is being grown by the Czochralski method (CZ method) using a strain gauge.

2. Description of the Prior Art

In the Czochralski single crystal growth technology, it is known to automatically control the crystal diameter using the sectional area or diameter at the interface between a melt and the monocrystalline rod which is computed from an increment of a crystal's weight, or to control the position of the surface of the melt relative to a heater by moving a crucible up by the computed shift deducted from the pulled-up weight increment.

Such controls employ devices for measuring a pulling-up load of a monocrystal rod which incorporates a load cell.

However, if a load cell with a wire resistance strain gauge incorporated is used to detect the load of the monocrystalline rod that is being lifted by a wire rope, a lot of continuous wave-shaped noise is often detected, which is the cause of detection errors and thereby worsens practical use of the load cell. Use of a load cell has therefore been conventionally limited to a single crystal growth apparatus in which a monocrystalline rod is lifted by a shaft. This also applies to a load cell which employs a strain gauge of a type other than the wire resistance type strain gauge.

The pulling shaft is moved up and down several meters in accordance with a required pulling-up stroke, and this results in a technically or economically unbearable increase in the overall size of the single crystal growth apparatus.

SUMMARY OF THE INVENTION

In view of the aforementioned problems of the prior art, an object of the present invention is to provide a precision load measuring device for pulling up a monocrystal rod that utilizes a strain gauge which is capable of measuring the load of a monocrystalline rod lifted by a wire rope.

In order to achieve the above-described object, the present invention provides a load measuring device for pulling up a monocrystalline rod being grown by the Czochralski method which utilizes a strain gauge, where especially the monocrystalline rod is lifted by a wire rope consisting of multiple strands and the periphery of the hanging wire is duly inscribed on at least part of the semicircular cross-sectional shape of a guide groove near the loosening point of the wire of the guide pulley.

In consequence, the center line of the wire rope is kept substantially fixed at its rotational center regardless of the angle of rotation of the wire rope, and the load of the monocrystalline rod when lifted by the wire rope can be thereby measured with a high degree of accuracy using the strain gauge.

BRIEF DESCRIPTION OF THE DRAWINGS

FIGS. 3 and 4 show in an enlarged manner the cross-sections of a guide groove 40 formed in the outer periphery of a guide pulley 34 of the device of FIG. 1 into which a wire rope 38 is fitted;

FIGS. 5 and 6 show in an enlarged manner the cross-sections of a guide groove 40A formed in the outer periphery of the guide pulley 34 of a conventional crystal rod growth apparatus into which the wire rope 38 is fitted;

DESCRIPTION OF THE PREFERRED EMBODIMENTS

Embodiments of the present invention will be hereinunder described.

Figure 1:
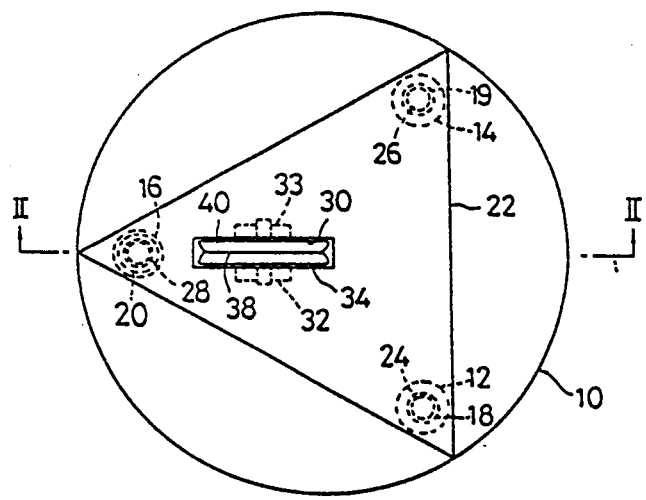
FIG. 1 is a plan view of a rotating section with a winding drum and a load cell.
Figure 2:
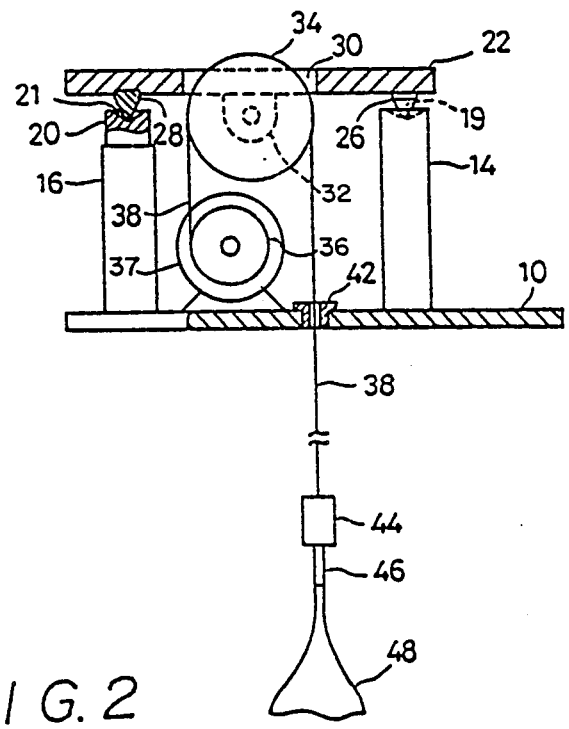
FIG. 2 is a partial cross-section taken along the line II—II of FIG. 1.

Referring first to FIG. 1 which is a plan view of a rotating section with a winding drum and a load cell and to FIG. 2 which is a partial cross-section taken along the line II—II of FIG. 1, the upper surface of a base plate 10 is provided with poles 12, 14, and 16 which are equidistantly disposed. The poles 12 and 14 have the same height, and the upper ends of the poles 12 and 14 are provided with recesses 18 and 19, respectively. The height of the pole 16 is slightly smaller than those of the poles 12 and 14. A load cell 20 which employs a wire resistance type strain gauge is fixed to the upper end of the pole 16. The upper end of the load cell 20 is at the same height as the upper ends of the poles 12 and 14. The upper end of the load cell 20 is provided with a recess 21 for receiving a load, like those of the poles 12 and 14.

Each corner of the under surface of a triangular ceiling plate 22 is provided with a leg 24, 26 or 28. The legs have the same shape in which the distal end is sharpened, and those distal ends are disposed at the center of the recesses 18, 19, and 21, respectively.

The ceiling plate 22 is provided with an opening 30 which is elongated in parallel with the direction of a line which is in the upper surface and a vertical plane including the center of one of the legs and the gravitational center of the ceiling plate. Brackets 32 and 33 are provided along the longitudinal sides of the opening 30 and on the lower surface of the ceiling plate 22, and a guide pulley 34 is rotatably supported by the brackets 32 and 33.

A winding drum 36 which is driven by a motor 37 is fixed above the base plate 10. The cylindrical surface of the winding drum 36 is provided with a helical groove (not shown), and a wire rope 38 is wound into the groove. The wire rope 38, which is drawn from the winding drum 36, is partly wound around the guide pulley 34 in a guide groove 40 formed in the outer peripheral surface thereof, and passes then through the hole in a guide bushing 42 fixed at the center of the base plate 10.

A seed crystal 46 is held in a holder 44 fixed at the lower end of the wire rope 38. It is immersed in a melt (not shown) located below it. A monocrystalline rod 48 is grown as the seed crystal is pulled up from the melt.

The winding drum 36 is rotatably driven. It is also driven in the axial direction by a known device. The wire rope 38 extending between the winding rum 36 and the guide pulley 34 is always kept perpendicular. During the growth of the crystal, the base plate 10 is rotated about its center, whereby the monocrystalline rod 48 is rotated about its axis also.

Next, the guide groove 40 and the wire rope 38 fitted thereinto will be described in detail.

Turning to FIGS. 3 to 6, the wire rope 38 consists of four strands a, b, c, and d, each of the strands a, b, c, and d being in turn composed of N strands (not shown), each of the N strands comprising M metal single wires (not shown). Such a wire rope is hereinafter referred to as a $4 \times N \times M$ wire rope.

Conventionally, the wire rope 38 is fitted into a guide groove 40A having a semicircular cross-sectional shape, as shown in FIGS. 5 and 6. The guide groove 40A has a diameter A sufficiently larger than the diameter D of a circle 50 circumscribing the wire rope 38 so as to prevent the hanging wire rope 38 from touching the edges of the guide groove 40A when it sways during the rotation of the monocrystalline rod 48. For example, if D is 1.8 mm, A is 2.4 mm. When the output of the load cell 20 was recorded on a sheet of chart paper utilizing the guide pulley 34 with the guide groove 40A formed in its outer periphery, a result such as that shown in FIG. 7 was obtained.

Figure 8:
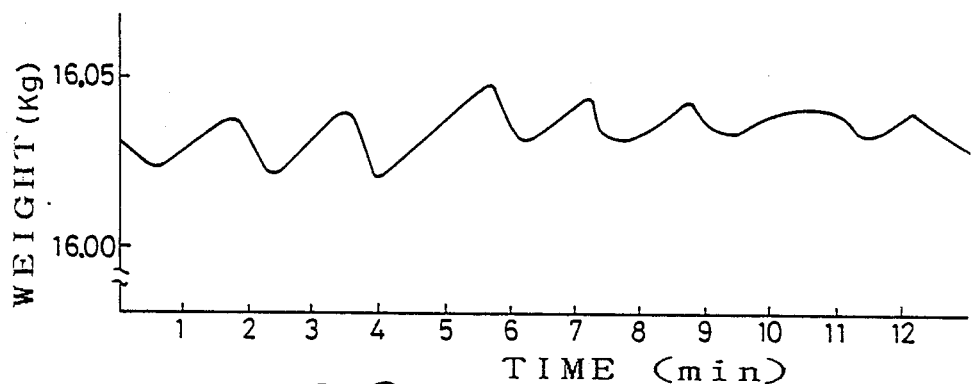
FIGS. 8 and 9 are graphs of the reading values detected by the load cell 20 of the apparatus of FIG. 1.

When the output of the load cell 20 was recorded on a sheet of chart paper utilizing the guide pulley 34 with the guide groove 40 formed in its outer periphery having a shape such as that shown in FIGS. 3 and 4, the result shown in FIG. 8 was obtained.

Figure 7:
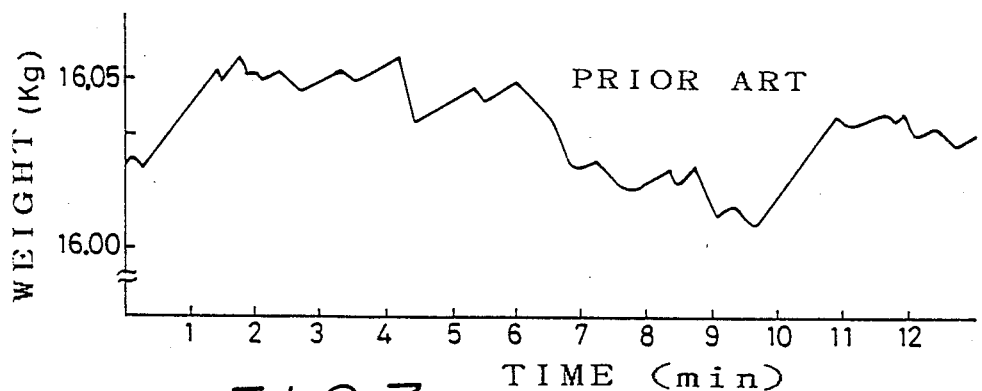
FIG. 7 is a graph of the load values detected by a load cell 20 employed in the conventional apparatus of FIGS. 5 and 6 with respect to time elapsed.

In both of the above-described cases, shown in FIGS. 7 and 8, a $4 \times 7 \times 19$ wire rope 38 was used. The pull rate of the wire rope 38 was 1 mm/min. Further, rotation of the base plate 10 generates noises having a short frequency and a small amplitude. However, they are omitted in the graphs shown in FIGS. 7 and 8, because they can be electrically removed with a low-pass filter.

It can be observed from the graphs shown in FIGS. 7 and 8 that differently shaped noise waves are generated between with different cross-sectional shapes of the guide groove, and that the noise generated when a guide pulley having the guide groove 40 is employed is of a much smaller level than that of the noise generated with the guide groove 40A.

In the cross-sectional shape P Q R S T of the guide groove 40 shown in FIGS. 3 and 4, a portion Q R S which forms the bottom thereof is one half of a circle, and its diameter is substantially equal to the diameter D of the circumcircle 50. Therefore, even if the wire rope 38 falls behind the rotation of the base plate 10 and discontinuously rotates about the center C, the distance between the center C and the central bottom point R of the guide groove 40 remains substantially the same. On the other hand, in the case shown in FIGS. 5 and 6, when the wire rope 38 rotates about the center C, the distance between the center C and the central bottom point R varies at the maximum by $\Delta$, causing the monocrystalline rod 48 to drop suddenly into the melt by a distance, though it is small.

Further, eccentric rotation of the monocrystalline rod 48, which from time to time occurs during the process for some reason, causes the wire rope 38 to sway or makes the rotation speed of the wire rope 38 non-uniform. Therefore, in the case of the guide groove 40A, the center C of the wire rope 38 that should be in the axis of symmetry of the cross section (the axis that passes through the central bottom point R) may be shifted from the axis and returned to the axis at unexpected intervals. This, however, does not apply to the wire rope 38 fitted in the guide groove 40.

The present inventors have conducted various experiments and found that the variation $\Delta$ and the shift of the wire rope 38 sideways are the cause of the cyclical noise waves.

The upper side portions P Q and S T of the guide groove 40 are inclined outwardly with respect to the axis of symmetry of the cross section by $\theta\,^{\circ}$ in such a way that the inclination increases the opening of the groove. The $\Delta$ may be 7.5. The edges delimiting the guide groove above the designations P and T are rounded.

Figure 9:
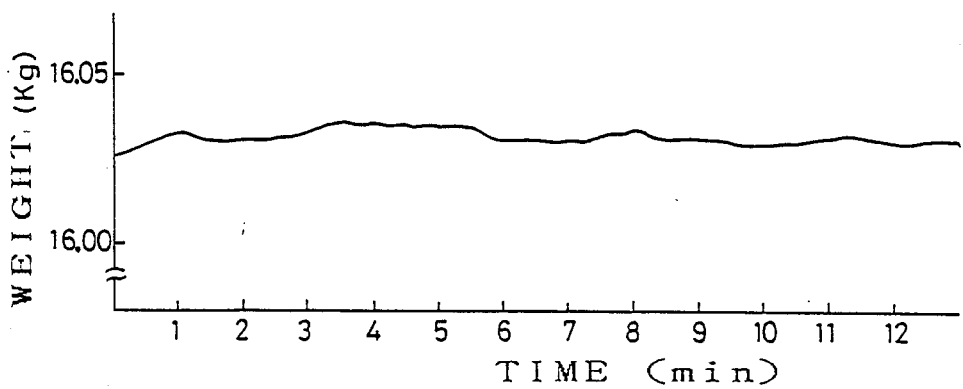

When the output of the load cell 20 was recorded on a sheet of chart paper utilizing the guide pulley 34 with the guide groove 40 formed in its outer periphery and the $19 \times 19 \times 1$ wire rope 38, it showed an extremely low level of cyclical noise waves, as shown in FIG. 9.

Thus, it is clear that, when the part of the guide groove 40 is substantially equal one half of the circumcircle 50, the level of the noise waves becomes low, and that the noise level lower as the contour of the wire rope 38 approaches circle, which is achieved by increasing the number of strands.

Where a wire rope having a large of strands such as a $19 \times 19 \times 1$ wire rope is used, in invention, i.e., where the wire rope is pulled up while is being rotated, the wire rope may become untwined during use, precluding smooth rotation of the monocrystalline 48. Therefore, there is a limit to the increase in of strands, depending on the rotation speed of the rope and the maximum weight of the monocrystalline 48.

In the above-described embodiment guide pulley 34 is used. However, the wire rope 38 alternatively unwound directly from the winding drum In that case, the guide groove would be embodied as a helical groove formed in the outer peripheral surface the winding drum 36.

In the above embodiment, the ceiling plate 22 is supported at one point by the load However, it may be supported at two or more points by the cells. This ensures a higher degree of measurement because the lifting load is distributed over several load cells.

The above-described embodiment employs one type of strain gauge which is a wire resistance type strain gauge. However, an optical, electric capacitance, or magnetostrictive type strain gauge may also be used.

The present invention can be applied to any type of monocrystalline rod manufacturing apparatus, including a silicon semiconductor manufacturing apparatus or a compound semiconductor manufacturing apparatus, which grows a monocrystalline rod by the Czochralski method.

What is claimed is:

1. A device for measuring the lifting up load of a crystal rod grown by the Czochralski method, comprising:
    a wire rope consisting of multiple strands, said wire rope having one end connected to said crystal rod through a seed crystal holder to lift up said crystal rod;
    a motor;
    a drum driven by said motor, having a helical groove formed in the peripheral surface of said drum for winding and guiding said wire rope, the remaining end of said wire rope connected to said drum;
    a first base;
    a load cell mounted to said first base;

a second base supported by said first base through said load cell; and a pulley rotatably supported by said second base, said pulley having a guide groove formed in a peripheral surface thereof for guiding said wire rope between said drum and said crystal holder, a part of the cross-sectional shape of said guide groove being substantially identical to a semicircle circumscribing said wire rope.

2. A device according to claim 1, wherein said cross-sectional shape of said guide groove of said pulley is broadened outwardly.

3. A device according to claim 2, wherein said guide groove is round at both edges.

4. A device according to claim 2, wherein said motor is mounted on said first base.

5. A device according to claim 4, wherein said first base comprises:

a base plate on which said motor is mounted; and poles fixed standing on an upper surface of said base plate, said load cell mounted on an upper end of at least one of said poles.

6. A device according to claim 5, wherein said second base comprises:

a ceiling plate rotatably supporting said pulley; and legs fixed on the lower surface of said ceiling plate, each lower end of said legs being put on one of said poles and load cell.

7. A device according to claim 6, wherein each said pole and load cell have a recess at an upper end, each said leg having sharpened free end which is put at the center of said recess respectively.

* * * * *